(12) United States Patent
Nagase et al.

(10) Patent No.: US 7,128,979 B2
(45) Date of Patent: Oct. 31, 2006

(54) CIRCUIT BOARD, METHOD OF PRODUCING SAME, AND POWER MODULE

(75) Inventors: Toshiyuki Nagase, Naka-gun (JP); Yoshiyuki Nagatomo, Naka-gun (JP)

(73) Assignee: Mitsubishi Materials Corporation, Tokyo (JP)

( * ) Notice: Subject to any disclaimer, the term of this patent is extended or adjusted under 35 U.S.C. 154(b) by 0 days.

(21) Appl. No.: 10/510,199

(22) PCT Filed: Apr. 21, 2003

(86) PCT No.: PCT/JP03/05054

§ 371 (c)(1),
(2), (4) Date: Sep. 29, 2004

(87) PCT Pub. No.: WO03/090277

PCT Pub. Date: Oct. 30, 2003

(65) Prior Publication Data

US 2005/0214518 A1    Sep. 29, 2005

(30) Foreign Application Priority Data

Apr. 19, 2002  (JP) ............................. 2002-118359
Mar. 27, 2003  (JP) ............................. 2003-088129

(51) Int. Cl.
*B22F 3/00*   (2006.01)
*H01L 23/10*  (2006.01)
(52) U.S. Cl. ...................... 428/545; 428/210; 428/615; 428/627; 257/706; 257/753; 228/121; 228/180.21
(58) Field of Classification Search ................ 428/210, 428/545, 615, 627; 257/706, 753; 228/121, 228/180.21
See application file for complete search history.

(56) References Cited

U.S. PATENT DOCUMENTS 5,130,498 A * 7/1992 Yoshida et al. ............. 174/252
5,213,877 A * 5/1993 Yoshida et al. ............. 428/209

FOREIGN PATENT DOCUMENTS

| EP | 045229 A2 | 4/1991 |
|---|---|---|
| EP | 0 874 399 A1 | 10/1998 |
| GB | 2 337 162 A1 | 11/1999 |
| JP | 02-032590 A1 | 2/1990 |
| JP | 02-232326 A1 | 9/1990 |
| JP | 03-060186 A1 | 3/1991 |
| JP | 03-060192 A1 | 3/1991 |
| JP | 03-125463 A1 | 5/1991 |
| JP | 08-335652 | 12/1996 |
| JP | 09-315875 | 12/1997 |

(Continued)

OTHER PUBLICATIONS

Patent Abstracts of Japan for JP08-335652 published on Dec. 17, 1996.

(Continued)

*Primary Examiner*—Cathy F. Lam
(74) *Attorney, Agent, or Firm*—Darby & Darby

(57) ABSTRACT

A circuit board including conductive layers bonded to both surfaces of an insulating ceramic substrate, with a brazing material disposed therebetween. The conductive layers comprise at least 99.98% by mass of aluminum, and display an average crystal grain diameter within a range from 0.5 mm to 5 mm and a standard deviation σ for that crystal grain diameter of no more than 2 mm. Each conductive layer comprises at least 20 ppm of Cu, Fe and Si. The surface area of the crystal with the maximum crystal grain diameter within the conductive layers accounts for no more than 15% of the surface area of the insulating ceramic substrate.

9 Claims, 6 Drawing Sheets

FOREIGN PATENT DOCUMENTS

| | | |
|---|---|---|
| JP | 10-065075 A1 | 3/1998 |
| JP | 11-220073 A1 | 8/1999 |
| JP | 11-317482 A1 | 11/1999 |
| JP | 2000-077583 A1 | 3/2000 |
| JP | 2000-340912 | 12/2000 |
| JP | 2001-53199 | 2/2001 |
| JP | 2001-168250 | 6/2001 |
| JP | 2002-129313 A1 | 5/2002 |

OTHER PUBLICATIONS

Nagatomo et al., Non-published pending U.S. Appl. No. 10/743,081 filed Dec. 23, 2003.

* cited by examiner

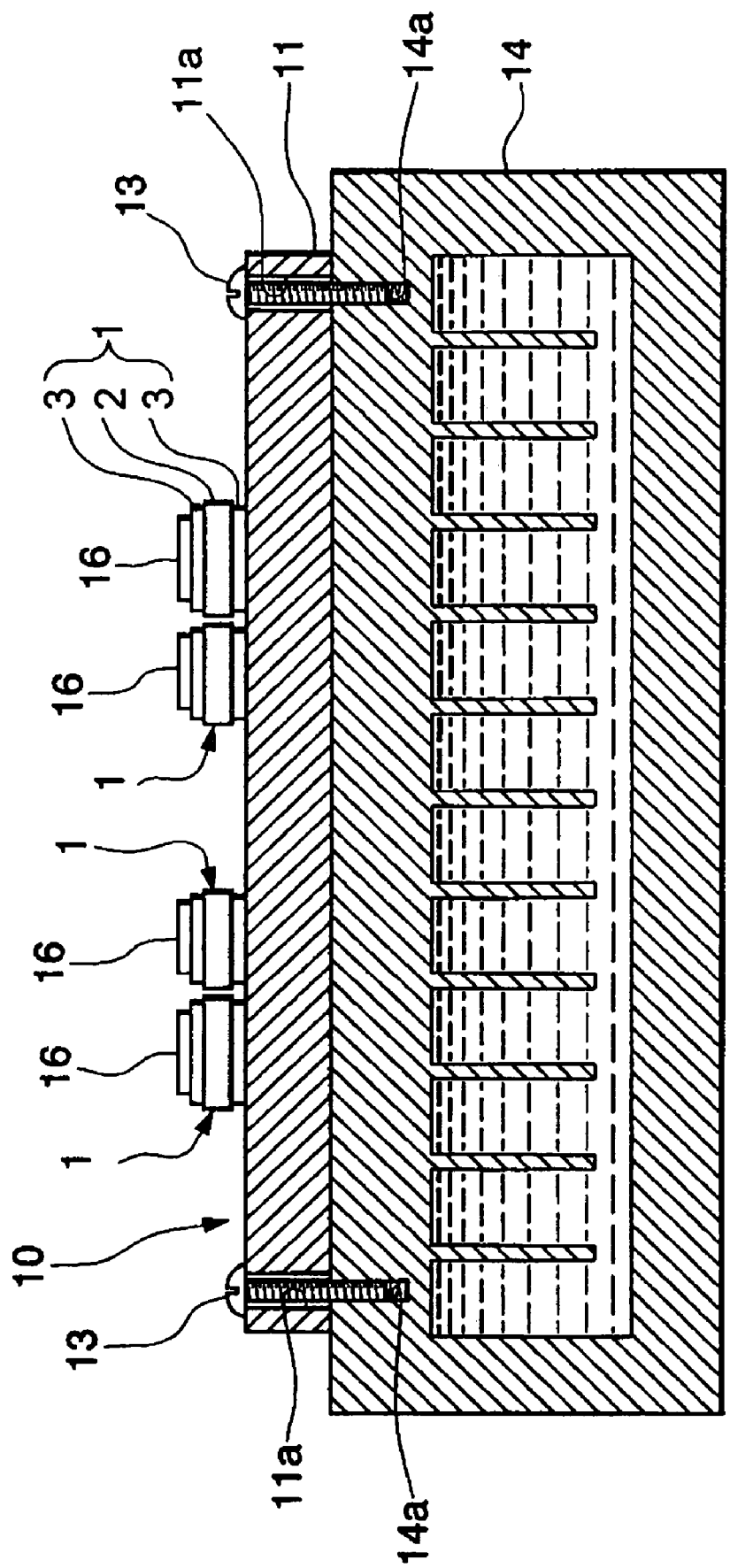

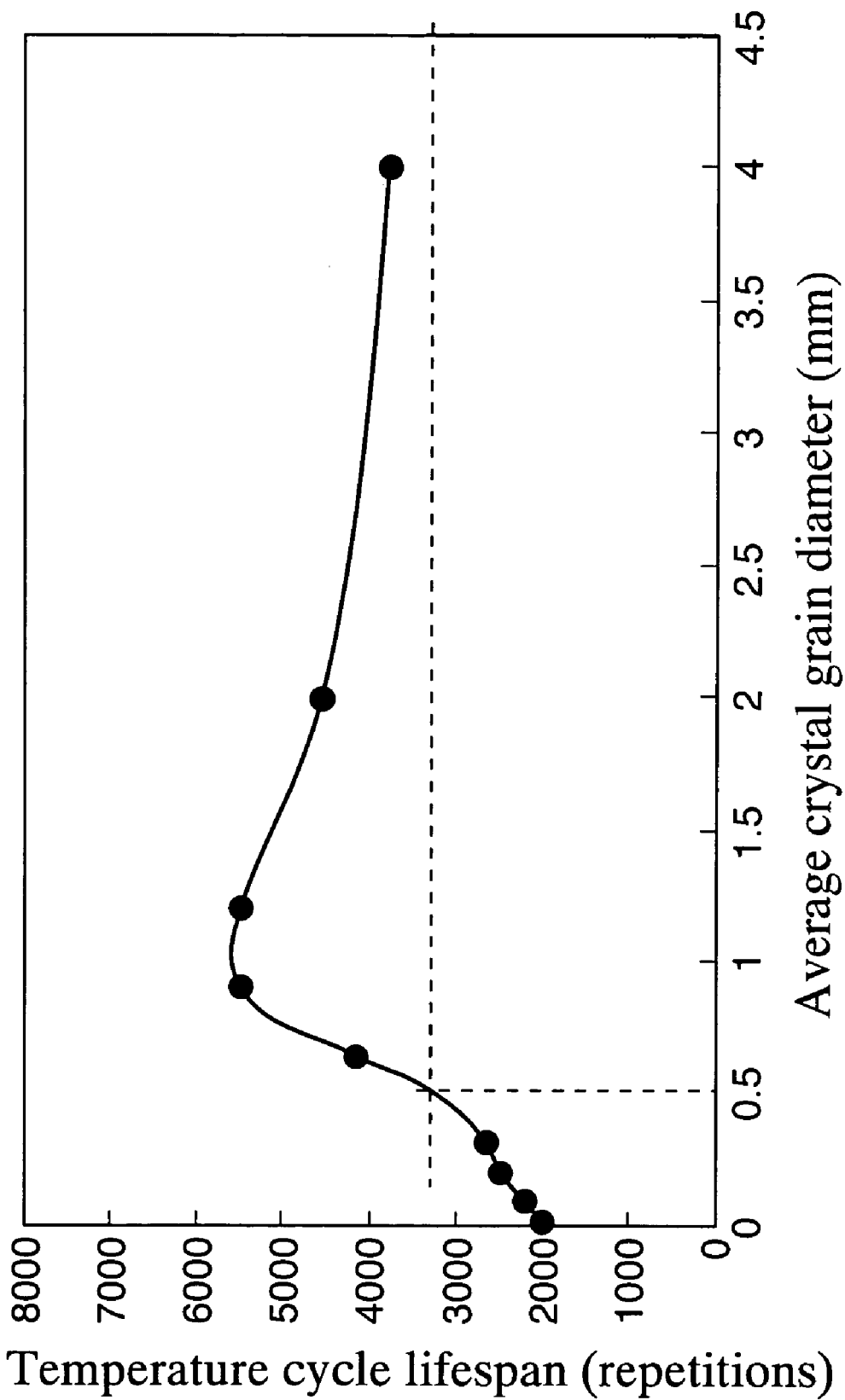

CIRCUIT BOARD, METHOD OF PRODUCING SAME, AND POWER MODULE

CROSS-REFERENCE TO PRIOR APPLICATION

This is a U.S. national phase application under 35 U.S.C. §371 of International Patent Application No. PCT/JP03/05054 filed Apr. 21, 2003, and claims the benefit of Japanese Patent Application Nos. 2002-118359 filed Apr. 19, 2002 and 2003-88129 filed Mar. 27, 2003 which are incorporated by reference herein. The International Application was published in Japanese on Oct. 30, 2003 as WO 03/090277 A1 under PCT Article 21(2).

TECHNICAL FIELD

The present invention relates to a power module, as well as a circuit board used in a power module, and a method of producing the circuit board. This technology is particularly applicable to the power modules for high-reliability inverters used in HEV (Hybrid Electric Vehicles) and the like.

BACKGROUND ART

Conventionally, the semiconductor devices used in power modules and the like use circuit boards in which a conductive layer of Cu or Al, and a heat radiating plate are formed on the front and rear surfaces of a ceramic substrate consisting of alumina, beryllia, silicon nitride or aluminum nitride or the like. This type of circuit board enables a high level of insulation to be obtained in a more stable manner than composite substrates formed from a resin substrate and a metal substrate, or resin substrates.

In those cases where the conductive layer and the heat radiating plate are Cu, the generation of thermal stress caused by the differing levels of thermal expansion of the ceramic substrate and the solder is unavoidable, and as a result, the long term reliability tends to be unsatisfactory. In contrast, in those cases where the conductive layer and the heat radiating plate are Al, although the thermal conductivity and electrical conductivity are inferior to those of Cu, the Al can readily undergo plastic deformation if exposed to thermal stress, enabling the thermal stress to be alleviated, and as a result, the reliability is superior.

Japanese Unexamined Patent Application, First Publication No. 2001-53199 and Japanese Unexamined Patent Application, First Publication No. Hei 8-335652 disclose related technology.

In order to bond rolled Al plates to both surfaces of an insulating ceramic, bonding must be conducted at a high temperature of at least 500° C., using a brazing material. In such cases, following the brazing process, warping can develop when the structure is returned to normal temperatures, and this warping can cause problems in the circuit board production process and the assembly process used for producing power modules.

As shown in FIG. 3A, it is thought that the cause of this warping is the Al crystals within the conductive layer growing overly large during the brazing process. If the crystal grain diameter becomes overly large, then anisotropy develops in the mechanical characteristics of the conductive layers formed on both surfaces of the insulating ceramic substrate, and the resulting unbalanced stresses cause warping. In those cases where conductive layers are bonded to both the front and rear surfaces of an insulating ceramic substrate, the two conductive layers are preferably of the same thickness in order to ensure better stress balance.

The grain diameter of Al crystals can be controlled by increasing the quantity of added elements, although as the quantity of added elements increases, the ability of the Al to alleviate stress is reduced. As a result, if the 0.2% proof stress value or the work hardening coefficient of the Al exceed certain reference values, then when, for example, −40° C. to 125° C. temperature cycle testing is conducted, the ceramic substrate may develop cracking.

The present invention takes the above circumstances into consideration, with an object of reducing circuit board warping, and preventing ceramic substrate cracking.

DISCLOSURE OF INVENTION

A circuit board of the present invention comprises conductive layers bonded to both surfaces of an insulating ceramic substrate, wherein the conductive layers comprise at least 99.98% by mass of aluminum, and display an average crystal grain diameter that falls within a range from 0.5 mm to 5 mm, and a standard deviation $\sigma$ of the crystal grain diameter of no more than 2 mm.

The crystal grain diameter of a conductive layer can be measured by etching the surface of the conductive layer with an aqueous solution of NaOH, HF or Ga or the like, and once the macro structure of the conductive layer has been exposed, inspecting the structure using an optical microscope or an electron microscope (SEM).

The conductive layers may use a rolled material comprising 20 ppm or more of each of Cu, Fe and Si. The conductive layers may be rolled with a draft of at least 15%. In such cases, abnormal growth of the Al crystals can be suppressed, enabling a reduction in the variation of the crystal grain diameter.

The surface area of the crystal with the maximum crystal grain diameter preferably accounts for no more than 15% of the surface area of the insulating ceramic substrate. In such cases, the effect of the present invention in preventing anisotropy of the mechanical characteristics of the conductive layers is particularly strong.

The insulating ceramic substrate may be formed from at least one of $Al_2O_3$, AlN and $Si_3N_4$. The conductive layers may be bonded to the insulating ceramic substrate using a brazing material. The brazing material may be one or more materials selected from a group consisting of Al—Si based materials, Al—Ge based materials, Al—Mn based materials, Al—Cu based materials, Al—Mg based materials, Al—Si—Mg based materials, Al—Cu—Mn based materials, and Al—Cu—Mg—Mn based materials. In such cases, the bonding between the conductive layers and the insulating ceramic substrate is favorable.

A power module of the present invention comprises a circuit board described above, and a heat radiating plate for supporting the circuit board. At least a portion of a conductive layer of the circuit board may be bonded to the heat radiating plate using a brazing material with a lower melting point than the above brazing material.

A method of producing a circuit board according to the present invention comprises the steps of positioning a conductive layer comprising at least 99.98% by mass of aluminum on top of an insulating ceramic substrate with a brazing material disposed therebetween, pressure welding these components using a pressure within a range from 50 kPa to 300 kPa, and bonding the conductive layer and the insulating ceramic substrate together via the brazing material by heating to a temperature of at least 600° C. in either a vacuum or an inert gas atmosphere, wherein the average crystal grain diameter of the conductive layer is within a range from 0.5 mm to 5 mm, and the standard deviation a of the crystal grain diameter is no more than 2 mm.

The above production method may comprise an additional step for producing the conductive layer by heat treating a plate material comprising at least 99.98% by mass of aluminum, and then conducting rolling with a draft of at least 15%. By ensuring a draft of at least 15% from the final heat treatment, the 0.2% proof stress value of the conductive layer can be set at no more than approximately 35 N/mm$^2$, and the Al material work hardening coefficient can be set at no more than approximately 0.18. As a result, the effect of the present invention in preventing cracking of the ceramic substrate on exposure to repeated temperature variations can be further strengthened. For example, if a −40° C. to 125° C. temperature cycle test is conducted, then the number of cycles before cracking develops in the substrate can be increased. A temperature cycle test is a test in which a temperature treatment, in which a single cycle involves, for example, holding the circuit board at −40° C. for 30 minutes and then at 125° C. for 30 minutes in a thermal shock tester, is carried out repeatedly.

According to the present invention, because the average crystal grain diameter of the conductive layer is kept within a range from 0.5 mm to 5 mm, and the standard deviation $\sigma$ of the crystal grain diameter is no more than 2 mm, anisotropy is unlikely to develop in the mechanical characteristics of the conductive layer, enabling a reduction in the occurrence of warping of the circuit board. Furthermore, because the conductive layer comprises at least 99.98% by mass of aluminum, the stress alleviating capabilities of the layer are good, and cracking of the ceramic substrate is unlikely even when exposed to temperature variation. Accordingly, the present invention enables not only a reduction in the warping of the circuit board, but also enables prevention of other problems such as cracking of the ceramic substrate on exposure to temperature variation.

If the average crystal grain diameter of a conductive layer exceeds 5 mm, then anisotropy is more likely to develop in the mechanical characteristics of the conductive layer, increasing the probability of substrate warping. If the average crystal grain diameter is less than 0.5 mm, then the mechanical characteristics can vary, leading to an increase in the work hardening coefficient for example, and when the layer is exposed to temperature variation, the flow stress can increase, meaning an increased probability of both ceramic substrate cracking, and cracking in the soldered portions of the semiconductor chip. If the standard deviation of the crystal grain diameter exceeds 2 mm, then the variation in the crystal grain diameter of the conductive layer becomes overly large, increasing the possibility of anisotropy developing in the mechanical characteristics.

The average crystal grain diameter of the conductive layer is even more preferably within a range from 0.8 mm to 1.5 mm, and the standard deviation a of the crystal grain diameter is even more preferably 1 mm or smaller. In such cases, problems such as cracking of the ceramic substrate on exposure to temperature variation can be even more reliably prevented.

BRIEF DESCRIPTION OF THE DRAWINGS

FIG. 3A and FIG. 3B are schematic illustrations for describing the measurement of the crystal grain diameter, wherein FIG. 3A shows an example of crystals according to the conventional technology, and FIG. 3B shows an example of the crystals in a conductive layer of a circuit board according to the present invention.

FIG. 4 is a cross sectional view showing an embodiment of a power module according to the present invention.

FIG. 5 is a graph showing the relationship between the average crystal grain diameter and the temperature cycle lifespan for examples according to the present invention.

DETAILED DESCRIPTION OF THE INVENTION

As follows is a description of embodiments of a circuit board and a method of producing the circuit board according to the present invention, based on the drawings.

Figure 1:
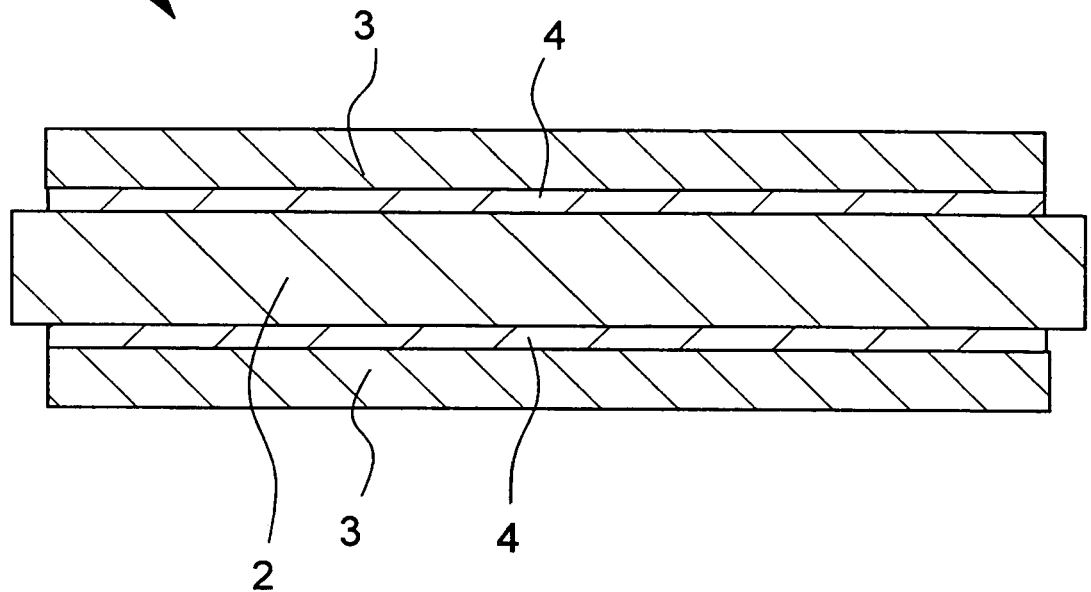
FIG. 1 is a cross sectional view showing an embodiment of a circuit board according to the present invention.

FIG. 1 is a cross sectional view showing a circuit board 1 of an embodiment according to the present invention. This circuit board 1 comprises Al plates (conductive layers) 3 bonded to both surfaces of an insulating ceramic substrate 2 via brazing material layers 4.

There are no particular restrictions on the material used for the insulating ceramic substrate 2, although preferred materials include either one material, or a composite of two materials, selected from a group consisting of $Si_3N_4$, AlN, and $Al_2O_3$. Of these, AlN is particularly preferred. AlN has a high thermal conductivity of 170 to 200 W/mK, and because this value is similar to that of the Al of the conductive layer, the heat from a Si chip mounted on top of the conductive layer can be dissipated rapidly. Furthermore, AlN has a low coefficient of thermal expansion of $4.3 \times 10^{-6}$/° C., and because this value is similar to the coefficient of thermal expansion for a Si chip, cracking is less likely to develop in the solder securing the Si chip. There are no particular restrictions on the thickness of the insulating ceramic substrate 2, and typical examples are from 0.3 to 1.5 mm. The shape of the insulating ceramic substrate 2 is normally rectangular, although other shapes are also possible.

The Al plates 3 comprise at least 99.98% by mass of Al. If the Al content is lower than this value, then the stress alleviating effect of the Al plates 3 is reduced, and warping of the circuit board 1 or cracking of the ceramic substrate 2 on exposure to temperature variations becomes increasingly likely. There are no particular restrictions on the thickness of the Al plates 3, and typical examples are from 0.25 to 0.6 mm. In a more specific example, the insulating ceramic substrate 2 comprises an AlN plate of thickness 0.635 mm, and the Al plates 3 have a thickness of 0.4 mm. The Al plates 3 may be either bonded to the entire surface of the ceramic substrate 2, or bonded to only a portion of the ceramic substrate 2. For example, as shown in FIG. 1, the Al plates 3 may be formed on only those portions of the ceramic substrate 2 inside, but excluding, the periphery.

There are no particular restrictions on the thickness of the brazing material layers 4, and typical examples are from 0.005 to 0.05 mm. In a more specific example, the thickness is approximately 0.03 mm. There are no particular restrictions on the material used for the brazing material 4, although one or more materials selected from a group consisting of Al—Si based materials, Al—Ge based materials, Al—Mn based materials, Al—Cu based materials, Al—Mg based materials, Al—Si—Mg based materials, Al—Cu—Mn based materials, and Al—Cu—Mg—Mn based materials is preferred. The Al content of all of these brazing materials is typically within a range from 70 to 98% by mass. Of these materials, Al—Si based brazing materials and Al—Ge based brazing materials are preferred. The reason for this preference is that Al—Si based brazing materials and Al—Ge based brazing materials are less likely to generate intermetallic compounds, because if these intermetallic compounds are generated, they are likely to be the cause of cracking during the aforementioned temperature cycle testing at −40° C. to 125° C. Furthermore, because these intermetallic compounds are less likely to form, bonding can be conducted at lower pressures. One example of an Al—Si based brazing material is an alloy comprising 95 to 75% by mass of Al and 3 to 20% by mass of Si, which has a melting point (eutectic point) of 577° C.

The average crystal grain diameter of the Al plates 3 is within a range from 0.5 mm to 5 mm, and the standard deviation a of the crystal grain diameter is no more than 2 mm. If the average crystal grain diameter exceeds 5 mm, then anisotropy is more likely to develop in the mechanical characteristics of the Al plates 3, increasing the probability of warping of the circuit board 1 on exposure to temperature variations. If the average crystal grain diameter is less than 0.5 mm, then the work hardening coefficient is likely to increase, the flow stress caused by temperature cycles may also increase, and the probability of both ceramic substrate cracking, and cracking in the soldered portions of the Si chip increases. If the standard deviation of the crystal grain diameter exceeds 2 mm, then the variation in the crystal grain diameter becomes overly large, increasing the possibility of anisotropy developing in the mechanical characteristics.

Figure 3A:
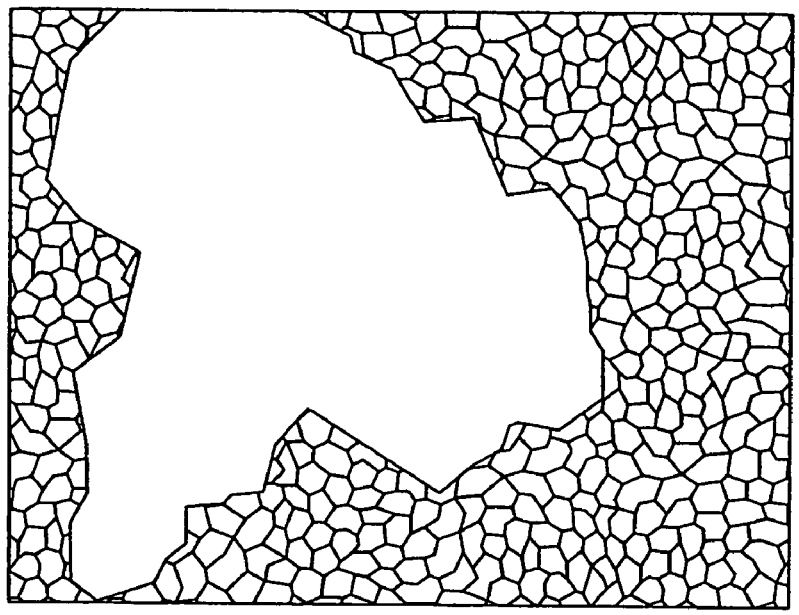
Figure 3B:
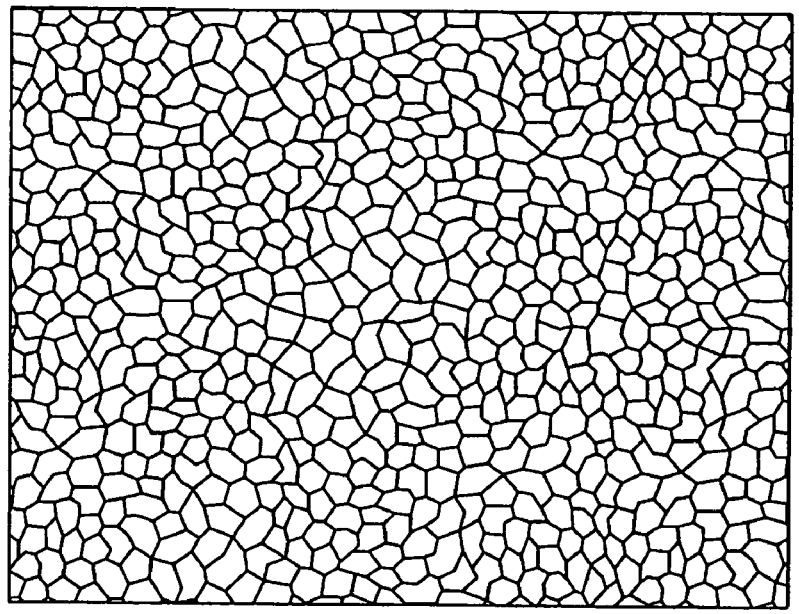

Measurement of the crystal grain diameter of an Al plate 3 is conducted in the manner described below. The surface of Al plate, which is bonded to the insulating ceramic substrate 2, is subjected to etching, exposing the macro structure of the conductive layer. An aqueous solution of NaOH, HF or Ga or the like can be used as the etchant. Following etching, the structure is washed with water and dried, and the structure of the crystal grains is then inspected using an optical microscope or an electron microscope (SEM). As shown in FIG. 3B, by conducting image processing of the microscope image, the average crystal grain diameter and the standard deviation can be measured. The maximum crystal grain diameter can also be determined at the same time.

One example of an image analysis method is described below. First, the surface of the Al plate 3 bonded to the ceramic substrate 2 is etched using one of the sets of conditions described below, thus preparing a sample in which the macro structure, namely the crystal grain boundaries, can be inspected.

Etching conditions (1): the surface of the Al plate 3 is etched for 3 minutes using fluoronitric acid (acidic ammonium fluoride: 100 g/l, nitric acid: 800 ml/l).

Etching conditions (2): the surface of the Al plate 3 is etched for 20 minutes using a 4% by mass aqueous solution of NaOH.

Etching conditions (3): the surface of the Al plate 3 is polished, Ga is applied, Ga is allowed to diffuse into the Al grain boundaries by heating at 50° C. for 2 hours, and the surface is then polished again to a mirror finish.

A photograph of the sample is then taken through either an optical microscope or an SEM or the like, each of the crystal grain boundaries within the photograph are identified using simple CAD software or the like, and image processing is then used to determine the surface area S of each crystal grain. These values are converted to an average grain diameter value using the formula shown below.

$$\text{Average grain diameter} = 2 \times \sqrt{(S/\pi)}$$

In addition, the average value of the grain diameter values and the standard deviation can then be determined from the distribution of the average grain diameter values across the entire photograph.

The surface area of the crystal with the maximum crystal grain diameter preferably accounts for no more than 15% of the surface area of the insulating ceramic substrate 2. In such cases, the degree of warping of the circuit board 1 can be reduced.

When the Al plates 3 are bonded to the insulating ceramic substrate 2, if the Al crystals undergo abnormal growth, then anisotropy can develop in the mechanical characteristics of the Al plates 3 formed on both surfaces of the ceramic substrate 2, leading to a larger degree of warping, but by setting the crystal grain diameter of the Al plates 3 in the manner described above, anisotropy in the mechanical characteristics of the Al plates 3 can be reduced, thus enabling a reduction in the warping of the circuit board 1.

The Al plates 3 bonded to the front and rear surfaces of the insulating ceramic substrate 2 are preferably of the same thickness. Furthermore, Al plates 3 are preferably bonded to both surfaces of the insulating ceramic substrate 2. The reason for this requirement is that if an Al plate 3 is only bonded to one surface, the insulating ceramic substrate 2 is more prone to warping. However, if required, a Al plate 3 may be formed on only one surface.

The Al plates 3 preferably comprise 20 ppm or more of each of Cu, Fe and Si. Such compositions enable suppression of excessive Al crystal growth, thus reducing the variation in the crystal grain diameter and reducing the probability of a portion of crystals becoming overly large, and are consequently unlikely to cause mechanical anisotropy. Particularly preferred compositions comprise from 20 to 60 ppm of Cu, from 20 to 40 ppm of Fe, and from 20 to 80 ppm of Cu. If the upper limits of these ranges are exceeded, then the 0.2% proof stress value or the work hardening coefficient exceed the aforementioned values (no more than approximately 35 N/mm$^2$ for the 0.2% proof stress, and no more than approximately 0.18 for the work hardening coefficient), and when the structure is exposed to temperature cycles, stress can develop at the interface between the Al plate and the insulating ceramic substrate, and at the soldered surface of the Si chip mounted on top of the conductive layer, leading to cracking of the insulating ceramic substrate or the solder.

Next is a description of a method of producing the circuit board 1 described above.

A sheet of brazing material 4, an insulating ceramic substrate 2, another sheet of brazing material 4, and an Al plate 3 are overlaid sequentially on top of another Al plate 3. A pressure of 50 to 300 kPa (0.5 to 3 kgf/cm$^2$) is then applied, and the structure is heated in a vacuum or an inert gas atmosphere (such as an Ar gas atmosphere) to a temperature of at least 600° C., but less than the melting point of the Al plates 3. This melts the brazing material 4, and bonds the insulating ceramic substrate 2 and the Al plates 3 strongly together.

The heating conditions are set so that the crystal grain diameter conditions described above can be satisfied. Following brazing, the structure is cooled to room temperature, and the Al plate 3 on one surface is etched into a pattern to form a circuit.

If the pressure during the lamination process is less than 50 kPa, then there is a danger of bonding irregularities occurring. If the pressure exceeds 300 kPa, then the ceramic substrate 2 is more prone to cracking during the bonding. If the heating temperature is less than 600° C., then the bonding is more likely to be unsatisfactory. Furthermore, if at least one of the conditions is outside the range specified above, it becomes more difficult to satisfy the crystal grain diameter conditions described above.

Figure 2:
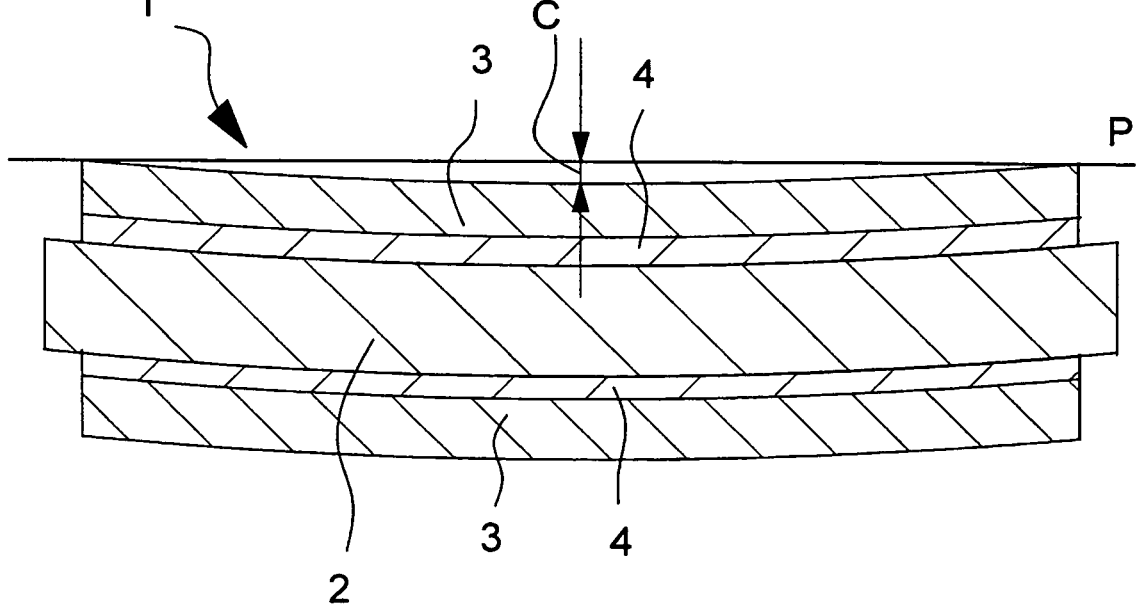
FIG. 2 is a cross sectional view describing the degree of warping.

In order to measure the degree of warping of a circuit board 1, two points separated by 100 mm are taken on a diagonal line across a 100 mm square circuit board 1, and the profile curve between these two points is measured using a three dimensional measuring device or a laser displacement gauge. As shown in FIG. 2, the maximum displacement C between this profile curve and the plane P is then measured. This measurement is performed along both intersecting diagonal lines of the circuit board 1, and the larger of the two maximum displacement values is defined as the degree of warping.

Crystal growth of the Al plates 3 can be suppressed by increasing the quantity of added elements, but the mechanical characteristics of the Al itself varies markedly depending on the concentration of the added elements, that is, the purity of the Al. In order to achieve the crystal grain diameter values described above, the Al plates 3 are preferably produced by subjecting a plate material comprising at least 99.98% by mass of aluminum to a final heat treatment at a temperature of 200 to 450° C., and then rolling the plate with a draft of at least 15%. This enables the 0.2% proof stress value of the Al plates 3 to be adjusted easily to a value of no more than approximately 35 N/mm$^2$, and the work hardening coefficient of the conductive layers to be set at no more than approximately 0.18. Accordingly, the stress alleviating effect can be enhanced, and the cracking of the circuit board during the conducting of −40° C. to 125° C. temperature cycle tests can be prevented. Furthermore, provided the draft from the final heat treatment is at least 15% for the Al plates 3, excessive growth of the crystal grains is unlikely to proceed.

According to the present embodiment, even if the insulating ceramic substrate 2 is formed from alumina, AlN or Si$_3$N$_4$ or the like with a Young's modulus of approximately 320 GPa which requires warp suppression, and even if the brazing material 4 is a material such as an Al—Si based material that requires heat treatment at a temperature of at least 500° C., and even 600° C. or higher, in the temperature range where growth of the crystal grains within the conductive layers occurs, by setting the average crystal grain diameter of the Al plates 3 within a range from 0.5 mm to 5 mm, and setting the standard deviation σ of the crystal grain diameter to no more than 2 mm, the occurrence of anisotropy in the mechanical characteristics of the Al plates 3 can still be reduced. Accordingly, the occurrence of thermal stress caused by a difference in thermal expansion between the insulating ceramic substrate 2 and the Al plates 3 can also be reduced, enabling the occurrence of warping or cracking in the circuit board 1 to be prevented, and enabling the long-term reliability of the circuit board to be improved.

Next is a description of a power module that represents another embodiment of the present invention. A circuit board 1 according to the above embodiment described above is mounted to a power module 10 according to this embodiment. FIG. 4 is a cross sectional view of the power module 10.

As shown in FIG. 4, the power module 10 comprises either one, or two or more, square circuit boards 1 secured to one of the main surfaces of a heat radiating plate 11. The heat radiating plate 11 is a plate material formed from an Al based alloy plate, and in a similar manner to the insulating ceramic substrate described above, preferably displays a high thermal conductivity (for example, 150 W/mK or greater) and a low coefficient of thermal expansion (for example, no more than 10×10$^{-6}$/° C.). AlSiC based materials, or three-layer structures in which Al is bonded to both surfaces of a perforated Fe—Ni alloy plate are particularly ideal. Furthermore, although there are no particular restrictions on the thickness of the heat radiating plate 11, typical examples are from 3 to 10 mm. The circuit boards 1 are the same as the circuit board of the first embodiment described above, and comprise an insulating ceramic substrate 2 of AlN or the like with a thickness of, for example, 0.3 to 1.5 mm, and first and second Al plates 3 bonded to both surfaces of the insulating ceramic substrate 2. The first and second Al plates 3 have a thickness of, for example, 0.25 to 0.6 mm. The circuit boards 1 are square with a length along one side of no more than 30 mm.

The circuit boards 1 are brazed to the heat radiating plate 11 using a brazing material. The brazing material preferably uses one or more materials selected from a group consisting of Al—Si based materials, Al—Cu based materials, Al—Mg based materials, Al—Mn based materials, and Al—Ge based materials. In order to braze the circuit boards 1 to the heat radiating plate 11, a sheet of brazing material and the circuit boards 1 are overlaid sequentially on top of the heat radiating plate 11, a pressure of 50 to 300 kPa is applied, and the structure is heated to a temperature of 580 to 650° C. in a vacuum or an inert gas atmosphere to melt the brazing material, before being cooled. The brazing material preferably has a melting point that is less than the melting point of the brazing material 4 described above, and materials with a melting point of 500 to 630° C., for example approximately 575° C., are ideal (wherein the melting point refers to the point at which the liquidus line is exceeded). In such cases, the heat radiating plate 11 and the first Al plates 3 can be bonded together without any melting of the brazing material 4 bonding the insulating ceramic substrate 2 and the Al plates 3.

In a power module 10 constructed in this manner, the opposite surface of the heat radiating plate 11 is bonded tightly to a water cooled heat sink 14 formed from an Al alloy or the like, by inserting male screws 13 into mounting holes 11a formed in the corners of the heat radiating plate 11, and engaging these male screws 13 into female screw holes 14a formed in the water cooled heat sink 14.

A power module 10 constructed in this manner displays the same effects as those described for the first embodiment. By mounting the circuit boards 1 described above, variation in the degree of shrinkage around the edges of the circuit boards 1 during heat cycles can be suppressed to comparatively low levels, and the heat cycle lifespan of the power module 10 can be extended. As a result, the reliability of the power module 10 can be improved.

EXAMPLES

As follows is a description of examples of the present invention.

Example 1

A power module of the structure shown in FIG. 4 was prepared.

On both surfaces of an AlN ceramic substrate 2 of dimensions 50 mm×50 mm×0.635 mm were bonded Al plates 3 with the same length and width dimensions as the insulating ceramic substrate 2 but with a thickness of 0.4 mm, thus preparing a circuit board 1. The Al plates 3 were prepared by a final heat treatment at 450° C., followed by rolling with a draft of 30%, and comprised 99.99% by mass of Al, as well as 23 ppm of Cu, 30 ppm of Si, and 33 ppm of Fe. The brazing material 4 used an Al—Si based brazing material comprising 8% by mass of Si. The melting point of this brazing material was 626° C. With an Al plate 3, a sheet of the Al—Si based brazing material 4, the insulating ceramic substrate 2, another sheet of the Al—Si based brazing material 4, and another Al plate 3 overlaid on top of one another, in that order, the layers were bonded together by subjecting the layered structure to a pressure of 200 kPa, heating at 630° C. in a vacuum, and after 10 minutes at this temperature, cooling the bonded structure.

Subsequently, a heat radiating plate 11 formed from AlSiC with dimensions of 100 mm×100 mm×3 mm and a series of Si chips 16 were prepared, and the circuit boards 1, the heat radiating plate 11, and the Si chips 16 were brazed together with solder, thus completing the power module 10. 30 of these power modules 10 were prepared, and used as samples of the example 1.

Examples 2 to 12 and Comparative Examples 1 to 6

The material for the insulating ceramic substrate, the brazing material, the final draft, the level of Al purity, and the quantities of Cu, Si, and Fe were varied as shown in Table 1, and 30 power modules were prepared for each example. In the case of the comparative examples, each comparative example was prepared with one property outside of the ranges specified by the present invention, namely, the Cu quantity in the comparative example 1, the Si quantity in the comparative example 2, the Fe quantity in the comparative example 3, the final draft in the comparative example 4, and the level of Al purity in the comparative example 5. In the comparative example 6, an Al plate was bonded to only one surface of the insulating ceramic substrate.

The surface of the Al plate 3 in a sample of each of the examples 1 to 12 and the comparative examples 1 to 6 was etched with a 2 to 5% aqueous solution of NaOH to expose the underlying macro structure, the crystal grain structure was inspected using an electron microscope (SEM), and image processing was then conducted to determine the average crystal grain diameter, the standard deviation, the maximum crystal grain diameter, and the proportion of the surface area of the insulating ceramic substrate 2 accounted for by the surface area of the crystal within the conductive layer with the maximum crystal grain diameter. The crystal grain diameter values were determined by measuring the surface area (S) of the crystal grain, and then doubling the value of the radius, obtained by taking the square root of the surface area value divided by pi ($\pi$) ($2 \times \sqrt{(S/\pi)}$). The results are shown in Table 1.

TABLE 1

| No. | Ceramic | Brazing material | Final draft | Al purity | Cu quantity | Si quantity | Fe quantity | Average crystal grain diameter (mm) | Standard deviation (mm) | Maximum crystal grain diameter (mm) |
|---|---|---|---|---|---|---|---|---|---|---|
| Example 1 | AlN | Al—8 wt % Si | 30% | 99.99% | 23 ppm | 30 ppm | 33 ppm | 2.9 | 0.7 | 4.0 |
| Example 2 | AlN | Al—8 wt % Si | 30% | 99.98% | 80 ppm | 35 ppm | 39 ppm | 1.9 | 0.7 | 3.1 |
| Example 3 | AlN | Al—8 wt % Si | 30% | 99.98% | 80 ppm | 35 ppm | 39 ppm | 2.0 | 1.0 | 4.0 |
| Example 4 | alumina | Al—8 wt % Si | 30% | 99.98% | 80 ppm | 35 ppm | 39 ppm | 1.8 | 0.9 | 3.2 |
| Example 5 | $Si_3N_4$ | Al—8 wt % Si | 30% | 99.98% | 80 ppm | 35 ppm | 39 ppm | 2.1 | 0.8 | 3.3 |
| Example 6 | $Si_3N_4$ | Al—4 wt % Si | 30% | 99.98% | 80 ppm | 35 ppm | 39 ppm | 2.3 | 0.9 | 3.7 |
| Example 7 | AlN | Al—8 wt % Si | 15% | 99.98% | 20 ppm | 60 ppm | 40 ppm | 3.4 | 1.1 | 4.6 |
| Example 8 | AlN | Al—8 wt % Si | 15% | 99.98% | 80 ppm | 20 ppm | 40 ppm | 2.1 | 0.8 | 3.2 |
| Example 9 | AlN | Al—8 wt % Si | 15% | 99.98% | 80 ppm | 60 ppm | 20 ppm | 1.7 | 0.7 | 3.1 |
| Example 10 | AlN | Al—8 wt % Si | 15% | 99.99% | 20 ppm | 20 ppm | 20 ppm | 3.9 | 1.3 | 4.8 |
| Example 11 | AlN | Al—12 wt % Si | 15% | 99.99% | 20 ppm | 20 ppm | 20 ppm | 4.2 | 1.4 | 4.9 |
| Example 12 | AlN | Al—45 wt % Ge | 15% | 99.99% | 20 ppm | 20 ppm | 20 ppm | 4.1 | 1.5 | 4.8 |
| Comparative example 1 | AlN | Al—8 wt % Si | 30% | 99.99% | 16 ppm | 32 ppm | 31 ppm | 22.9 | 15.5 | 84.9 |
| Comparative example 2 | AlN | Al—8 wt % Si | 30% | 99.99% | 25 ppm | 12 ppm | 16 ppm | 4.3 | 3.2 | 14.9 |
| Comparative example 3 | AlN | Al—8 wt % Si | 30% | 99.99% | 23 ppm | 28 ppm | 10 ppm | 3.8 | 3.2 | 15.0 |

TABLE 1-continued

| No. | Ceramic | Brazing material | Final draft | Al purity | Cu quantity | Si quantity | Fe quantity | Average crystal grain diameter (mm) | Standard deviation (mm) | Maximum crystal grain diameter (mm) |
|---|---|---|---|---|---|---|---|---|---|---|
| Comparative example 4 | AlN | Al—8 wt % Si | 10% | 99.99% | 23 ppm | 28 ppm | 39 ppm | 3.2 | 3.5 | 17.2 |
| Comparative example 5 | AlN | Al—8 wt % Si | 30% | 99.95% | 350 ppm | 500 ppm | 450 ppm | 21.9 | 5.5 | 46.7 |
| Comparative example 6 | AlN | Al—8 wt % Si | 30% | 99.99% | 23 ppm | 30 ppm | 33 ppm | 2.9 | 0.7 | 4.7 |

Comparative Tests and Evaluations

Power modules from each of the examples 1 to 12 and the comparative examples 1 to 6 were set in a thermal shock tester, and a temperature treatment, in which a single cycle involved −40° C. for 30 minutes, room temperature for 30 minutes, 125° C. for 30 minutes, and then room temperature for 30 minutes, was carried out repeatedly. After the completion of 100 temperature cycles, the sample was inspected for peeling between the circuit board 1 and the heat radiating plate 11, and between the insulating ceramic substrate 2 and the Al plate 3, and if no peeling was observed, the sample was subjected to a further 100 temperature cycles. This process was repeated, and the number of temperature cycles required until peeling was observed was recorded as the temperature cycle lifespan. The existence of peeling was determined by inspection under a magnifying glass. The results are shown in Table 2.

The degree of warping was also measured for each circuit board 1. Of the 30 samples, the number of samples for which problems developed in the production steps following bonding of the Al plates 3 was counted. This number of problems refers to the number of power modules for which problems occurred during either the circuit board production process, or the assembly process for producing the power module using the insulated circuit board. Examples of specific problems include excessive warping leading to cracking of the ceramic substrate upon mounting to the stage used for securing the substrate during the resist printing step required for forming the circuit pattern, and the development of solder voids during the soldering of the heat sink due to the warping. These results are also shown in Table 2.

TABLE 2

| No. | Degree of warping (μm) | Number of problems during production | Temperature cycle test results |
|---|---|---|---|
| Example 1 | 46 | 0/30 | Good for at least 3000 cycles |
| Example 2 | 32 | 0/30 | Good for at least 3000 cycles |
| Example 3 | 40 | 0/30 | Good for at least 3000 cycles |
| Example 4 | 38 | 0/30 | Good for at least 3000 cycles |
| Example 5 | 39 | 0/30 | Good for at least 3000 cycles |
| Example 6 | 48 | 0/30 | Good for at least 3000 cycles |
| Example 7 | 35 | 0/30 | Good for at least 3000 cycles |
| Example 8 | 33 | 0/30 | Good for at least 3000 cycles |
| Example 9 | 40 | 0/30 | Good for at least 3000 cycles |
| Example 10 | 45 | 0/30 | Good for at least 3000 cycles |
| Example 11 | 48 | 0/30 | Good for at least 3000 cycles |
| Example 12 | 48 | 0/30 | Good for at least 3000 cycles |

TABLE 2-continued

| No. | Degree of warping (μm) | Number of problems during production | Temperature cycle test results |
|---|---|---|---|
| Comparative example 1 | 305 | 5/30 | Solder between the insulated circuit board and the heat sink cracked after 1500 cycles |
| Comparative example 2 | 213 | 3/30 | Solder between the insulated circuit board and the heat sink cracked after 1500 cycles |
| Comparative example 3 | 195 | 3/30 | Solder between the insulated circuit board and the heat sink cracked after 1500 cycles |
| Comparative example 4 | 50 | 3/30 | Solder between the insulated circuit board and the heat sink cracked after 1500 cycles |
| Comparative example 5 | 225 | 4/30 | Peeling at the interface between the surface Al of the insulated circuit board and the ceramic after 500 cycles |
| Comparative example 6 | 315 | 4/30 | Solder between the insulated circuit board and the heat sink cracked after 1500 cycles |

As shown in Table 1, in the examples 1 to 12, by forming the Al plates 3 from a material for which the final draft was at least 15% and the purity was at least 99.98% by mass, and which comprised at least 20 ppm of Cu, at least 20 ppm of Si, and at least 20 ppm of Fe, the average crystal grain diameter fell within a range from 0.5 mm to 5 mm, and the standard deviation σ of the crystal grain diameter was no more than 2 mm. The power modules of the examples 1 to 12 all displayed favorable temperature cycle lifespan values.

In contrast, in the comparative examples 1 to 6, which did not satisfy all of the above conditions, the average crystal grain diameter values and the standard deviations did not satisfy the criteria of the present invention, and the temperature cycle lifespan values were shorter.

FIG. 5 shows the relationship between the average crystal grain diameter determined by testing, and the temperature cycle lifespan. From FIG. 5 it is evident that if the average crystal grain diameter is less than 0.5 mm, the temperature cycle lifespan shortens considerably to no more than 3100 repetitions. Furthermore, it is also evident that if the average crystal grain diameter for the conductive layer is within a range from 0.8 mm to 1.5 mm, then the temperature cycle lifespan is markedly longer, at approximately 5000 repetitions.

Figure 6:
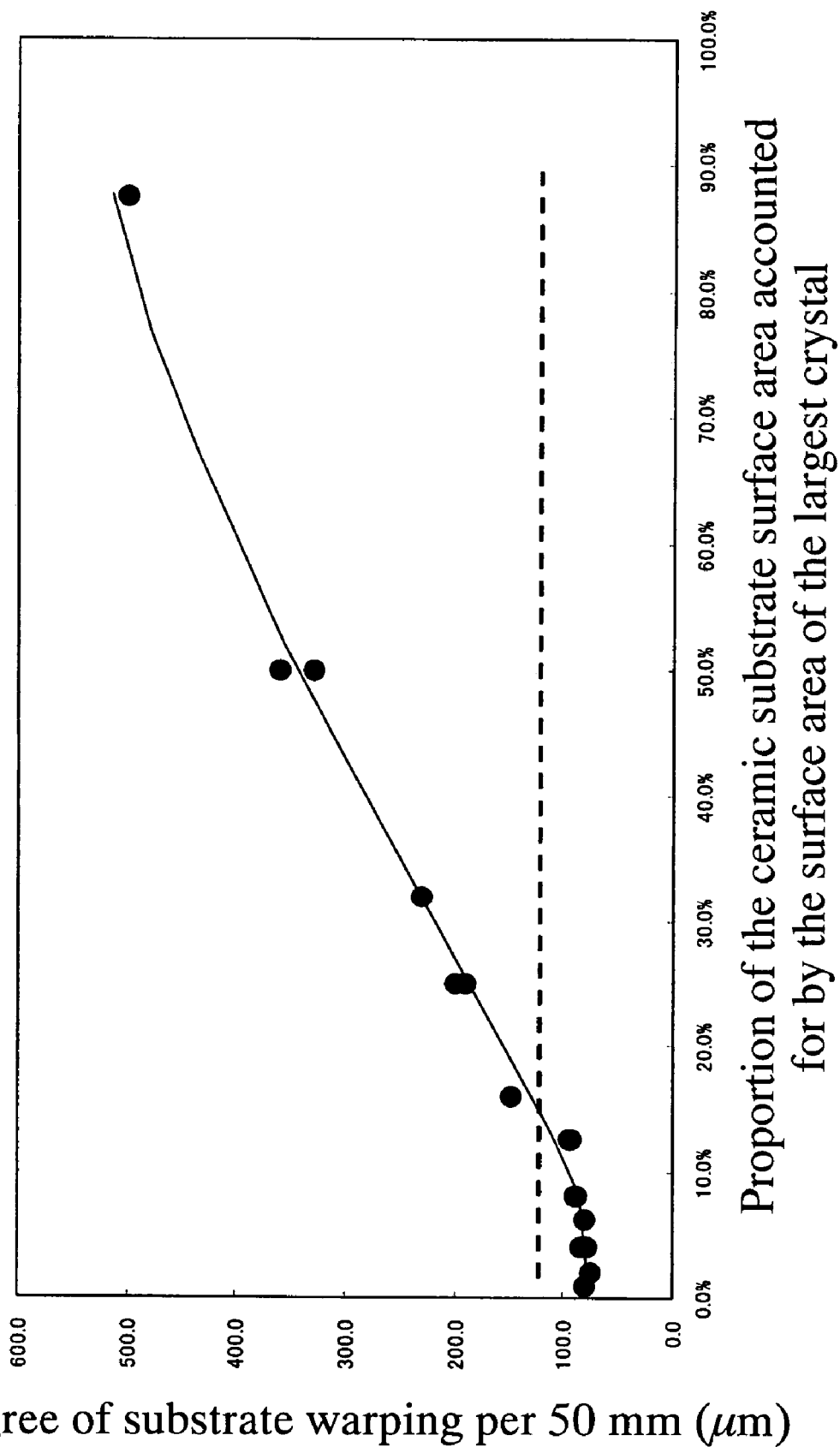
FIG. 6 is a graph showing the relationship between the proportion of the ceramic substrate surface area accounted for by the surface area of the largest crystal and the degree of warping for examples according to the present invention.

FIG. 6 shows the relationship between the proportion of the surface area of the insulating ceramic substrate accounted for by the surface area of the crystal within the conductive layer with the maximum crystal grain diameter, and the degree of warping. From FIG. 6 it is evident that if the maximum crystal grain diameter portion exceeds 15% of the entire substrate surface area, then the degree of warping of the substrate over a distance of 50 mm rapidly increases to a value of at least 120 μm.

Figure 7:
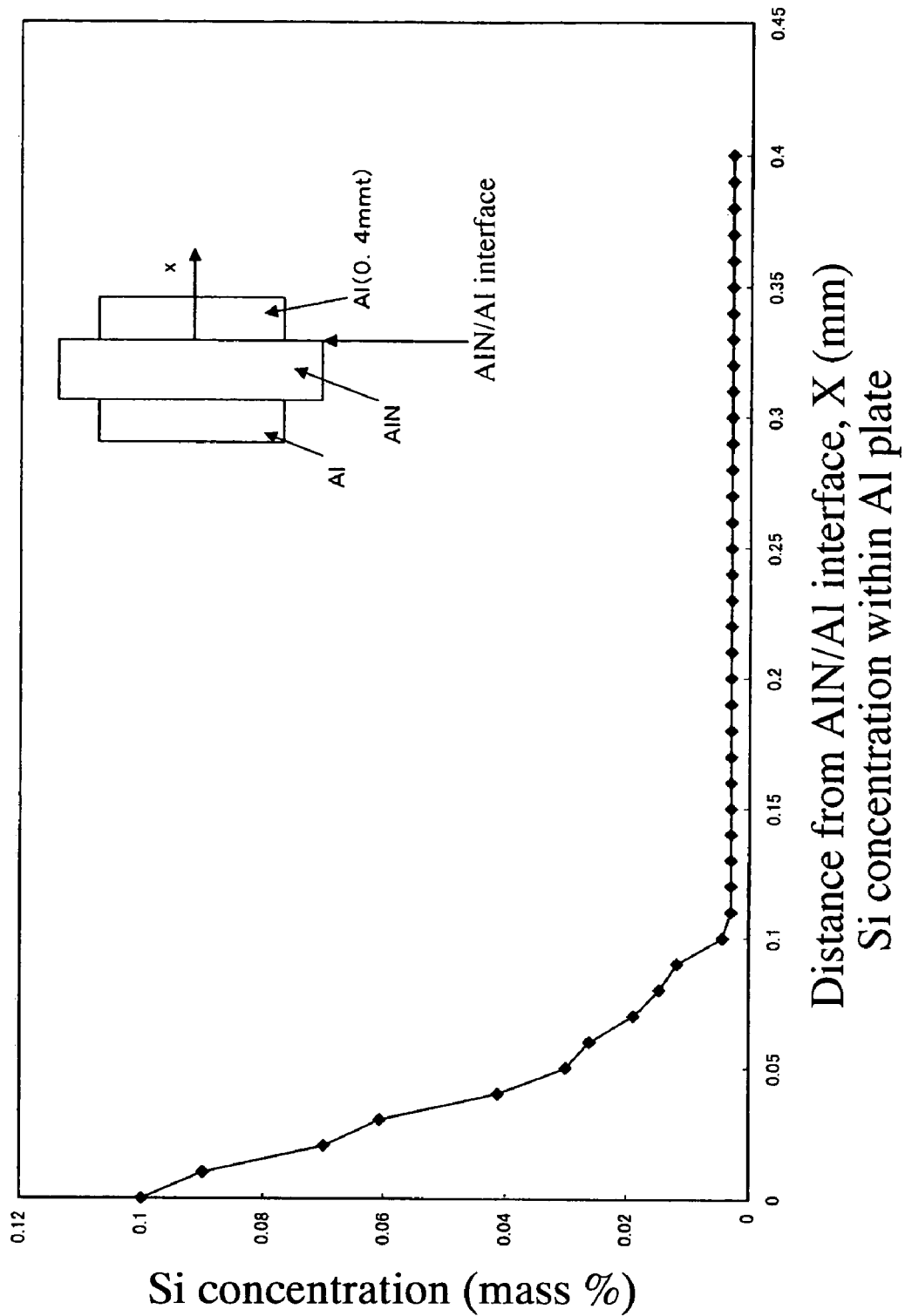
FIG. 7 is a graph showing the concentration distribution of Si diffused within an Al plate following bonding.

When the Si concentration within the Al plates was measured, it was found that during bonding of the Al plate and the AlN substrate, the Si contained within the brazing material diffuses into the Al plate. FIG. 7 is a graph showing the relationship between the distance X penetrated into the Al plate from the Al/AlN bonding interface, and the Si concentration. As shown in this graph, the depth to which the Si diffused was approximately 0.1 mm from the Al/AlN bonding interface. Accordingly, by performing an elemental analysis of the surface layer portion of the Al plate (with a thickness of approximately 0.1 mm for example), the inherent composition of the Al plate can be measured without any effect from the Si diffusion of the brazing material. Accordingly, microanalysis of Si: 20 to 60 ppm, Fe: 20 to 40 ppm, and Cu: 20 to 80 ppm can be performed with ease.

As shown in FIG. 7, in the vicinity of the Al plate/AlN substrate bonding interface, approximately 0.1% by mass of Si has diffused into the Al, causing a reduction in the Al purity to approximately 99.90% by mass. This type of Si diffusion means the portion of the Al plate in the vicinity of the bonding interface becomes relatively stronger, thus preventing the development of cracking. The remaining portion of the Al plate (a region incorporating approximately ¾ of the plate surface) is retained as high purity Al, meaning the flow stress is small, and thus enabling the stress acting on the AlN substrate during temperature cycle testing to be reduced.

INDUSTRIAL APPLICABILITY

According to the present invention, not only can warping of the circuit board be reduced, but the occurrence of problems such as cracking of the ceramic substrate on exposure to temperature variation can also be prevented.

The invention claimed is:

1. A circuit board comprising:
    an insulating ceramic substrate having two surfaces; and
    conductive layers bonded to both surfaces of the insulating ceramic substrate, wherein the conductive layers comprise at least 99.98% by mass of aluminum, and display an average crystal grain diameter within a range from 0.5 mm to 5 mm and a standard deviation σ of the crystal grain diameter less than or equal to 2 mm, and wherein the conductive layers comprise rolled materials comprising at least 20 ppm of each of Cu, Fe and Si.

2. A circuit board according to claim 1, wherein the conductive layers are rolled with a draft from a final treatment of at least 15%.

3. A circuit board according to claim 1, wherein a surface area of a crystal with maximum crystal grain diameter within the conductive layers accounts for less than or equal to 15% of a surface area of the insulating ceramic substrate.

4. A circuit board according to claim 1, wherein the insulating ceramic substrate is formed from at least one of $Al_2O_3$, AlN and $Si_3N_4$.

5. A circuit board according to claim 1, wherein the conductive layers are bonded to the surface of the insulating ceramic substrate using a brazing material, and the brazing material is one or more materials selected from a group consisting of Al—Si based materials, Al—Ge based materials, Al—Mn based materials, Al—Cu based materials, Al—Mg based materials, Al—Si—Mg based materials, Al—Cu—Mn based materials, and Al—Cu—Mg—Mn based materials.

6. A circuit board according to claim 1, wherein a surface area of a crystal with maximum crystal grain diameter within the conductive layers accounts for no more than 15% of a surface area of the insulating ceramic substrate, the insulating ceramic substrate is formed from at least one of $Al_2O_3$, AlN and $Si_3N_4$, the conductive layers are bonded to the surface of the insulating ceramic substrate using a brazing material, and the brazing material is one or more materials selected from a group consisting of Al—Si based materials, Al—Ge based materials, Al—Mn based materials, Al—Cu based materials, Al—Mg based materials, Al—Si—Mg based materials, Al—Cu—Mn based materials, and Al—Cu—Mg—Mn based materials.

7. A power module comprising a circuit board according to claim 1, and a heat radiating plate for supporting the circuit board.

8. A power module according to claim 7, wherein at least a portion of the conductive layer of the circuit board is bonded to the heat radiating plate using a circuit board brazing material with a lower melting point than the brazing material.

9. A method of producing a circuit board according to claim 8, comprising the steps of:
    producing the conductive layer, comprising the steps of;
    heat treating a plate material comprising at least 99.98% by mass of aluminum and at least 20 ppm of each of Cu, Fe and Si; and conducting rolling with a draft from a final heat treatment of at least 15%;
    positioning the conductive layer comprising at least 99.98% by mass of aluminum on top of an insulating ceramic substrate with a brazing material disposed therebetween;
    bonding the conductive layer and the insulating ceramic substrate together via the brazing material by compressing the conductive layer and the insulating ceramic substrate at a pressure within a range from 50 kPa to 300 kPa while heating to a temperature of at least 600° C. in one of a vacuum and an inert gas atmosphere;
    making an average crystal grain diameter of the conductive layer within a range from 0.5 mm to 5 mm; and
    making a standard deviation σ of the crystal grain diameter no more than 2 mm.

* * * * *